United States Patent
Nam et al.

(10) Patent No.: US 7,522,686 B2
(45) Date of Patent: Apr. 21, 2009

(54) CMOS BURST MODE CLOCK DATA RECOVERY CIRCUIT USING FREQUENCY TRACKING METHOD

(75) Inventors: Jang Jin Nam, Kyungbuk (KR); Hong June Park, Kyungbuk (KR)

(73) Assignee: Postech (KR)

( * ) Notice: Subject to any disclaimer, the term of this patent is extended or adjusted under 35 U.S.C. 154(b) by 653 days.

(21) Appl. No.: 11/148,761

(22) Filed: Jun. 9, 2005

(65) Prior Publication Data
US 2006/0031701 A1 Feb. 9, 2006

(30) Foreign Application Priority Data
Aug. 6, 2004 (KR) .................. 10-2004-0062078

(51) Int. Cl.
*H04L 7/00* (2006.01)
(52) U.S. Cl. .................. 375/355; 375/326; 375/371; 375/375; 375/376; 375/373; 713/500; 331/2; 327/158; 327/161
(58) Field of Classification Search .................. 375/326, 375/355, 371, 375, 376
See application file for complete search history.

(56) References Cited

U.S. PATENT DOCUMENTS

| | | | | |
|---|---|---|---|---|
| 5,400,370 A | * | 3/1995 | Guo | 375/371 |
| 5,418,496 A | * | 5/1995 | Ford et al. | 331/2 |
| 6,208,183 B1 | * | 3/2001 | Li et al. | 327/161 |
| 6,259,326 B1 | * | 7/2001 | Dunlop et al. | 331/2 |
| 7,010,077 B1 | * | 3/2006 | Dunlop et al. | 375/376 |
| 7,242,739 B2 | * | 7/2007 | Boles et al. | 375/375 |
| 7,302,026 B2 | * | 11/2007 | Kaeriyama et al. | 375/355 |
| 7,359,461 B2 | * | 4/2008 | Choi et al. | 375/326 |
| 2002/0090044 A1 | * | 7/2002 | Lee et al. | 375/373 |
| 2003/0169086 A1 | * | 9/2003 | Lee et al. | 327/158 |
| 2005/0218999 A1 | * | 10/2005 | Jasa et al. | 331/16 |
| 2005/0281366 A1 | * | 12/2005 | Shachar et al. | 375/376 |

* cited by examiner

*Primary Examiner*—Shuwang Liu
*Assistant Examiner*—Kenneth Lam
(74) *Attorney, Agent, or Firm*—Cantor Colburn LLP (57) ABSTRACT

Provided is a burst mode clock data recovery circuit for extracting clock information and data information from transmitted data to process data synchronized with clock. The circuit includes a bit-rate corrector generating an inversed signal at every half cycle of the clock when transition of input data is generated, the inversed signal maintaining a "high" value with respect to a continuous DC input, a first gated-voltage control oscillator connected to the bit-rate corrector in series, the operation thereof being controlled according to the inversed signal, and a bit-rate detector detecting input bit rate from the inversed signal, adjusting a digital code value of a predetermined bit, and controlling an operational frequency of a delay line of the bit-rate corrector and the first gated-voltage control oscillator to be identical to the input bit rate. The first gated-voltage control oscillator, the delay line of the bit-rate corrector, and the bit-rate detector receive a control voltage output from a phase locked loop.

22 Claims, 7 Drawing Sheets

FIG. 3A dumy data '1' inserted !!

FIG. 3B data '1' missing !!

COMMON MODE
FEEDBACK CIRCUIT

UNIT DELAY #1

FIG. 8

CMOS BURST MODE CLOCK DATA RECOVERY CIRCUIT USING FREQUENCY TRACKING METHOD

BACKGROUND OF THE INVENTION

1. Field of the Invention

The present invention relates to a clock data recovery circuit, and more particularly, to a clock data recovery circuit which extracts clock information and data information from the transmitted data in a burst mode.

2. Description of the Related Art

With a recent wide spread of a high speed chip-to-chip communication method such as Gigabit Ethernet, IEEE1394, and USB 2.0, a demand increases for an SER/DES (serializer/deserializer) design for converting high speed serial data transmitted via a cable to low speed parallel data which is easy to process. In a typical chip-to-chip communication, a clock signal is not separately transmitted while data only is transmitted through a communication channel. Accordingly, to process data synchronized with clock, a clock data recovery (CDR) circuit to extract clock information and data information from the transmitted data at a receiving end is needed.

In particular, in a plesiochronous system using a clock source at each of transmitting and receiving ends such as a passive optical network (PON) and ATM, and SDH/SONET, the CDR circuit having a fast lock time is necessary for processing asynchronous data transmitted in a packet format.

Figure 1A:
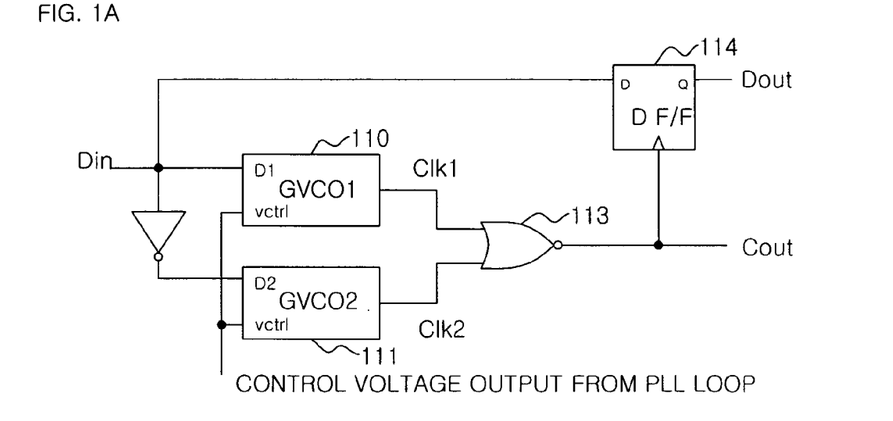
FIG. 1A is a block diagram illustrating the configuration and operation principle of a conventional burst mode CDR circuit in which two GVCOs operating in parallel are used.

FIG. 1A is a block diagram illustrating the configuration and operation principle of a conventional burst mode clock data recovery (CDR) circuit in which two gated-voltage controlled oscillators (GVCOs) operating in parallel are used. The conventional technology is described below with reference to the circuit diagram of FIG. 1A and a timing diagram of FIG. 1B.

An input signal Din and an inversed signal of the input signal Din are input to GVCOs 110 and 111, respectively. Another input of each of the GVCOs 110 and 111 is a control voltage output from a phase locked loop (PLL) (not shown). The first GVCO 110 generates an output signal Clk1 having a predetermined cycle when the input signal Din is maintain to be "low" as shown in the timing diagram of FIG. 1A. The second GVCO 111 generates an output signal Clk2 having a predetermined cycle when the input signal Din is maintain to be "high".

While passing through a NOR gate 113, the signals Clk1 and Clk2 are synchronized with the input signal Din and converted to a clock signal Cout having a very constant cycle. As the clock signal Cout is applied to a D-flipflop (D-F/F) 114 as a clock input, an output signal Dout of the D-F/F 114 becomes a signal that is generated by making the input signal Din synchronized with the clock signal Cout.

In other words, FIG. 1A shows a method of extracting the clock synchronized with data by extracting oscillating time points of the GVCOs 110 and 11 using the input data.

However, since each of the receiving and transmitting ends uses a separate clock source in the plesiochronous system, clock frequencies of the receiving and transmitting ends are different to a degree. Accordingly, a phase error is continuously accumulated due to a difference in a bit rate with respect to continuous input of DC data.

As a result, in the conventional CDR circuit based on the GVCO as shown in FIG. 1A, the maximum data bit number to be transmitted without transition is greatly restricted by the difference in the bit rate between the transmitting and receiving ends.

To improve the above drawbacks, a larger amount of transition needs to be applied to the transmitted data. A technology of using an encoding block such as 8B/10B at the transmitting end is a typical method for this purpose. The 8B/10b technology is a sort of data encoding technologies used for data transmission in a 10 gigabit Ethernet technology used for a back-bone such as LAN.

Figure 1B:
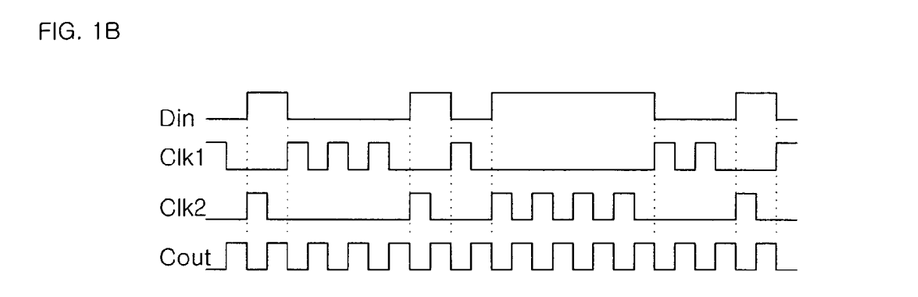
FIG. 1B is a timing diagram of the circuit of FIG. 1A.
Figure 1C:
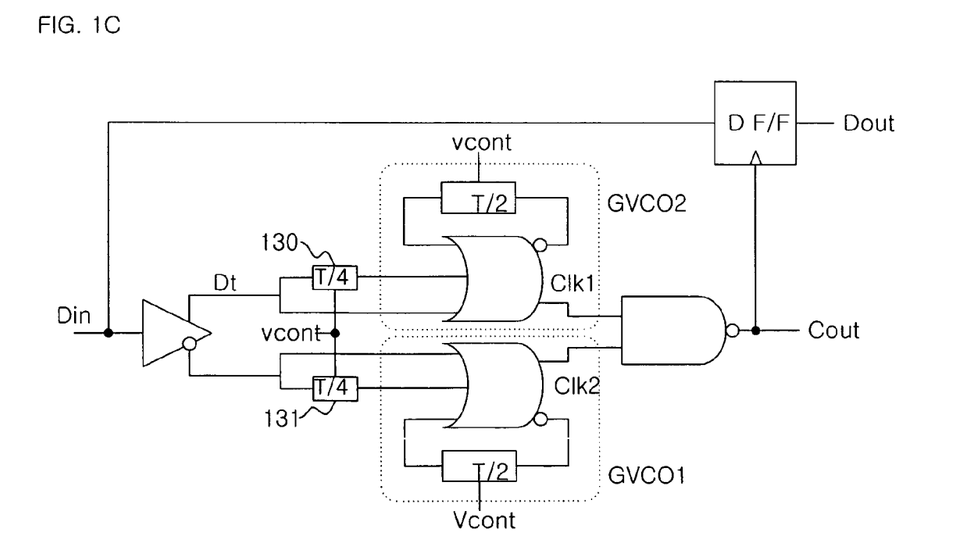
FIG. 1C is a block diagram illustrating the configuration and operation principle of another conventional burst mode CDR circuit in which a T/4 delay line is added to remove the high frequency noise of a recovered clock.

FIG. 1C shows the configuration of a conventional burst mode CDR circuit and the principle of operation thereof, in which T/4 delay lines 130 and 131 are added to remove a high frequency noise in recovered clock. That is, to remove the high frequency noise or glitches occurring in the recovered clock due to the difference in the bit rate, the oscillation time point of the GVCO is controlled using the input data Din and the T/4 delay lines 130 and 131.

Figure 1D:
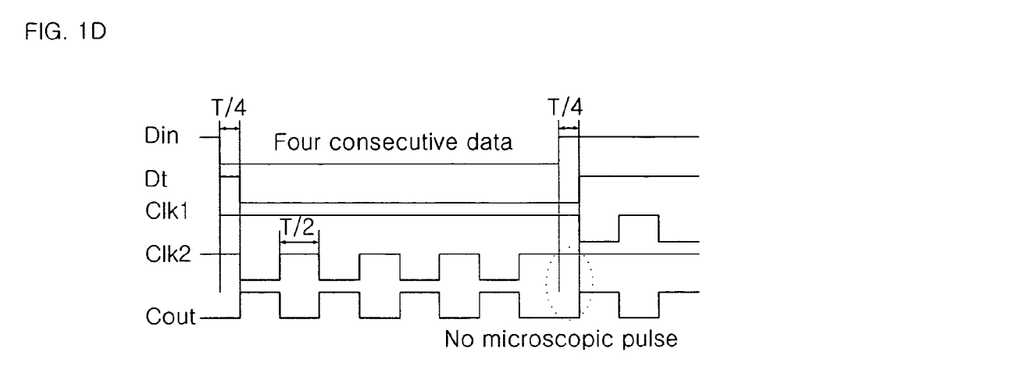
FIG. 1D is a timing diagram of the circuit of FIG. 1C.

The operation of the circuit is described with reference to a circuit diagram shown in FIG. 1C and a timing diagram shown in FIG. 1D.

The oscillation time point of the GVCO2 is controlled by the input data Din and T/4 delayed data. When these data are all "low", a clock signal Clk2 that is inversed every T/2 of a clock cycle is generated. When any one of the data is "high", the clock signal Clk2 is maintained to be "high".

Likewise, the inversed signal and the T/4 delayed signal of the input data Din control the oscillation time point of the GVCO1. When both signals are "high", the signal Clk1 is inversed every T/2. If any of the signals is "low", the signal Clik1 is maintained.

When the signals Clk1 and Clk2 respectively generated by the GVCO1 and the GVCO2 pass through a NAND gate, the clock signal Cout having a cycle T is synthesized and the synchronism of the output clock is characteristically maintained by the input data. In this case, since the amount of delay by the T/4 and T/2 delay lines is determined by a VCO control voltage vcont of the PLL at the receiving end, the T/4 and T/2 delay lines operate regardless of the bit rate of the transmitting end. Thus, in a method of using the T/4 delay element, as shown in FIG. 1A, even when a high frequency noise can be removed within a predetermined range, the allowance range is limited to several percentages.

Figure 2A:
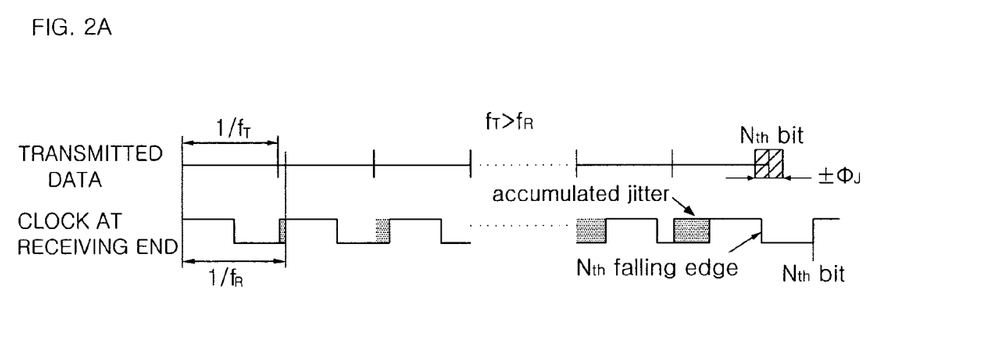
FIGS. 2A and 2B are timing diagrams showing the bit-rate difference between the transmitting end and the receiving end and the maximum DC data bit number to be transferred which is expressed in a formula with respect to the input jitter in the conventional burst mode CDR circuit structure.
Figure 2B:
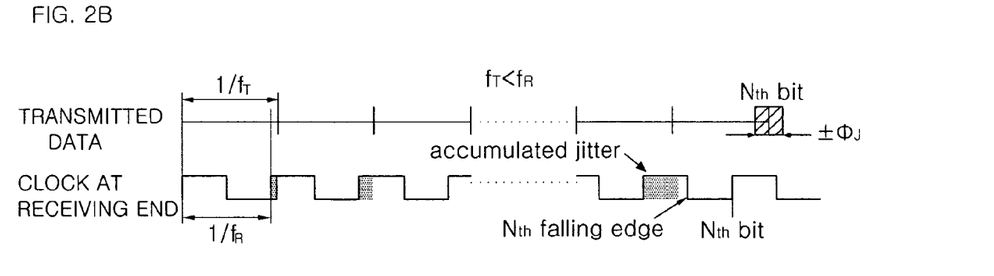

FIGS. 2A and 2B show that, in the conventional burst mode CDR circuit, a difference in the bit rate and input jitter affect the determination of the maximum DC data bit number to be transmitted. The amount of jitter existing in the transmitted data is indicated by $\pm\phi_j$ and it is assumed that data sampling is performed at a falling edge of a clock at the receiving end.

FIG. 2A shows a case in which the bit rate $f_T$ at the transmitting end is higher than the bit rate $f_R$ at the receiving end ($f_T > f_R$). When N-bit DC data is transmitted from the transmitting end, a phase error corresponding to a difference in the bit rate between the transmitting end and the receiving end is accumulated every clock. To accurately receive the N bits without error at the receiving end, at least the N-th falling edge of the clock at the receiving end must be anterior to the time point of (the N-th bits−$\phi_j$) of the transmitted data. That is, the maximum DC data bit number to be transmitted without error can be expressed in Inequality 1. However, it is assumed that 50% duty of the clock at the receiving end is guaranteed.

$$\frac{N - 0.5}{f_R} < \frac{N - \Phi_j}{f_T} \qquad \text{[Inequality 1]}$$

Unlike FIG. 2A, FIG. 2B shows a case in which the bit rate $f_T$ at the transmitting end is lower than the bit rate $f_R$ at the receiving end ($f_T < f_R$). To receive the N-bit DC data without error at the receiving end, in the worst case, the (N+1)th falling edge of the clock at the receiving end must be posterior to the time point of (the N-th bits+$\phi_j$) of the transmitted data. That is, the maximum DC data bit number to be transmitted without error can be expressed in Inequality 2.

$$\frac{N+0.5}{f_R} < \frac{N+\Phi_j}{f_T} \quad \text{[Inequality 2]}$$

From Inequalities 1 and 2, the maximum DC data bit number to be transmitted can be expressed in Inequality 3 that is a formula with respect to the input jitter $\phi_j$ and the bit rate difference $f_{diff}$.

$$N_{MAX} < \frac{1}{2f_{diff}} - (1-2\Phi_j), \text{ wherein } f_{diff} = \frac{|f_T - f_R|}{f_T} \quad \text{[Inequality 3]}$$

As shown in Inequality 3, the maximum DC data bit number to be transmitted logarithmically decreases as the bit rate difference increase and linearly decreases with respect to the input jitter.

Under a lossy channel environment such as USB 2.0 or Serial ATA, since allowable input jitter approaches 40%, it is still difficult to adopt the method shown in FIG. 1B. For this reason, the burst mode CDR circuit has been used for optical communication such as PON. For the lossy copper channel, a CDR circuit in a tracking manner using the PLL or the CDR circuit in an over-sampling manner has been used.

However, since the burst mode CDR circuit has merits such as a fast lock time and simple hardware structure, studies to use the burst mode CDR circuit in the lossy channel environment has been made.

The conventional burst mode CDR circuit using the GVCO has the following problems.

First, when the data transmission rate difference exists between the transmitting end and the receiving end, as the DC input data continuously transmitted, jitter is accumulated in the recovered clock so that the maximum DC data bit number to be transmitted is restricted. When the data transmission rate difference exists between the transmitting end and the receiving end affects the operation of the CDR circuit, the bit number of the output data may increase or decrease compared to that of the input data as shown in FIGS. 3A and 3B.

Figure 3A:
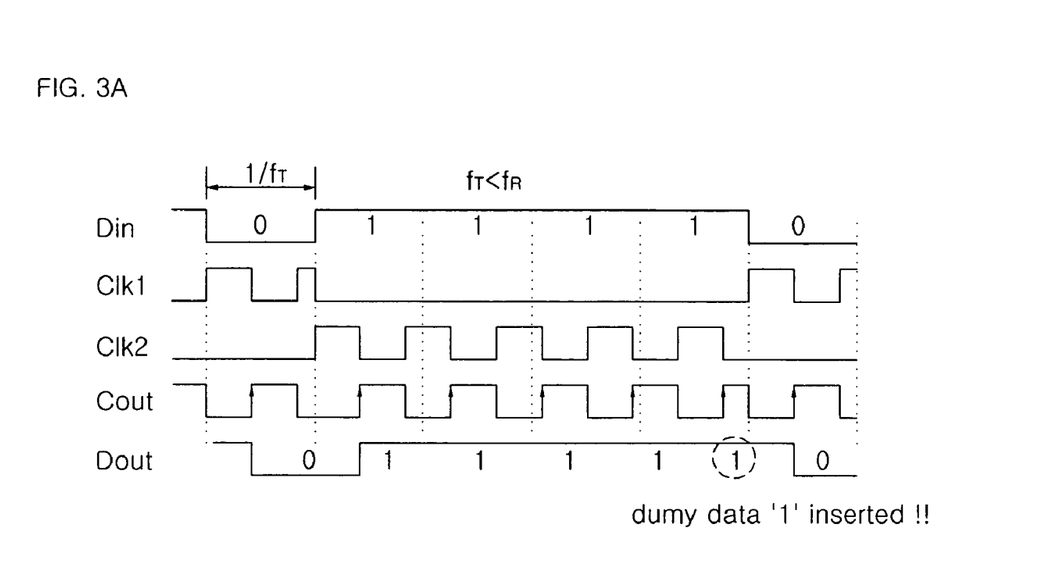
FIG. 3A is a timing diagram showing an effect of the bit-rate difference between the transmitting end and the receiving end on the operation of the CDR circuit, that is, an error of the output data Dout being greater than the input data Din by inserting a binary "1"
Figure 3B:
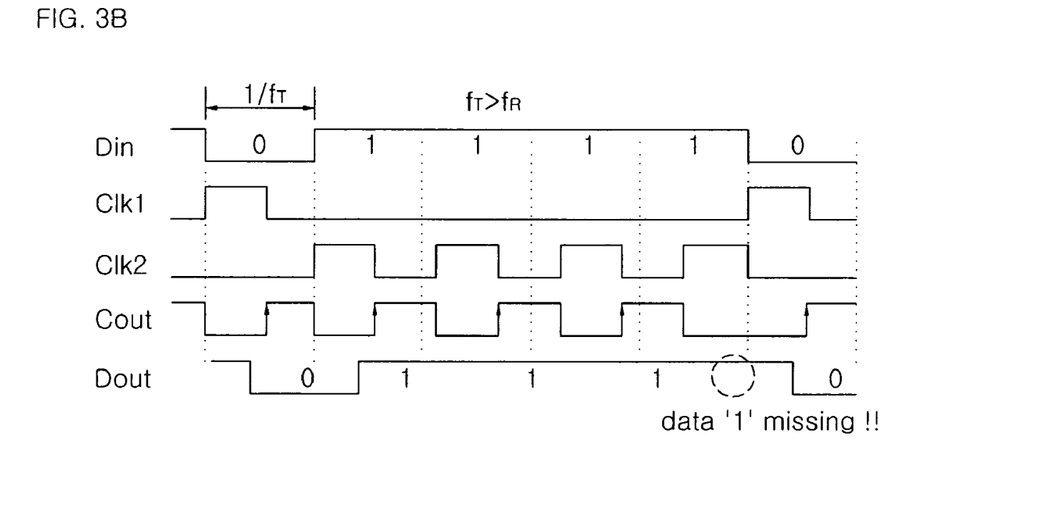
FIG. 3B is a timing diagram showing an effect of the bit-rate difference between the transmitting end and the receiving end on the operation of the CDR circuit, that is, an error of the output data Dout being less than the input data Din by loosing a binary "1"

FIG. 3A shows a case in which $f_R$ is greater than $f_T$ ($f_T<f_R$). As a result, a binary "1" is inserted in the output data Dout compared to the input data Din, which cases an error. FIG. 3B shows a case in which $f_R$ is less than $f_T$ ($f_T>f_R$). As a result, a binary "1" is lost from the output data Dout compared to the input data Din, which cases an error.

Second, the received data includes a great amount of jitter due to the ISI by the channel, the jitter by a power driving circuit at the transmitting end, the jitter of a clock generator at the transmitting end, and the jitter by a receiving circuit, so that errors can be generated in the recovered clock and data.

Third, unnecessary glitches are generated during the synthesis of the recovered clock due to mismatch between rising time and falling time of a VCO clock that generated when the gated-VCO constituting the burst mode CDR circuit is turned on/off. When the width of the glitch increases enough to be recognized by a CMOS circuit, a data receiving error is generated.

Fourth, in the conventional burst mode CDR circuit, the input data and the inversed information of the input data are used as the control signals to control the oscillating time points of the two VCOs operating in parallel. Thus, the result of mismatch between the VCOs is reflected in recovering the clock so that performance of the CDR circuit may be deteriorated.

SUMMARY OF THE INVENTION

To solve the above and/or other problems, the present invention provides a clock data recovery circuit including a bit-rate detector and a bit-rate corrector and operating in a digital method so that a fast frequency control is performed during a short preamble bit cycle.

According to an aspect of the present invention, a burst mode clock data recovery circuit for extracting clock information and data information from transmitted data to process data synchronized with clock comprises a bit-rate corrector generating an inversed signal at every half cycle of the clock when transition of input data is generated, the inversed signal maintaining a "high" value with respect to a continuous DC input, a first gated-voltage control oscillator connected to the bit-rate corrector in series, the operation thereof being controlled according to the inversed signal, and a bit-rate detector detecting input bit rate from the inversed signal, adjusting a digital code value of a predetermined bit, and controlling an operational frequency of a delay line of the bit-rate corrector and the first gated-voltage control oscillator to be identical to the input bit rate, wherein the first gated-voltage control oscillator, the delay line of the bit-rate corrector, and the bit-rate detector receive a control voltage output from a phase locked loop.

The bit-rate corrector comprises a T/2 delay line and an XNOR and generates a correction signal having information of a cycle T using a preamble bit having information of a cycle 2T.

The bit-rate detector comprises a T/2 delay line delaying half of the cycle of the clock T/2 of the inversed signal output from the bit-rate corrector, a flipflop in which output thereof is "high" or "low" as a rising edge of a signal having passed the T/2 delay line always samples a "high" or "low" portion of the inversed signal, a shift resister increasing the digital code value by one bit at every clock cycle during which a beat signal output from the flipflop is "high", and a lock detector detecting a state of the beat signal to maintain a lock signal to be "high" and discontinuing supply of the clock to the shift resister.

The bit-rate detector detects a difference in bit-rate between the transmitting end and the receiving end and generating a digital code value to correct the difference, by comparing a periodicity of a preamble data and a clock cycle at a receiving end.

The digital code is a digital thermometer code of multiple bits and controls the first gated-voltage control oscillator and a load capacitance value of the T/2 delay line to finely adjust operational frequencies of two unit blocks.

The shift resister comprises a plurality of blocks and each unit block comprises a D-flipflop and a MUX.

In the shift resister, to provide a T/2 delay value that is a half cycle of the clock signal as an initial value, a flipflop constituting an LSB 5 step is designed to be "set" and a flipflop constituting the other MSB 5 step is designed to be "reset".

The first gated-voltage control oscillator comprises a unit delay line having a function of controlling oscillating time.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 4A:
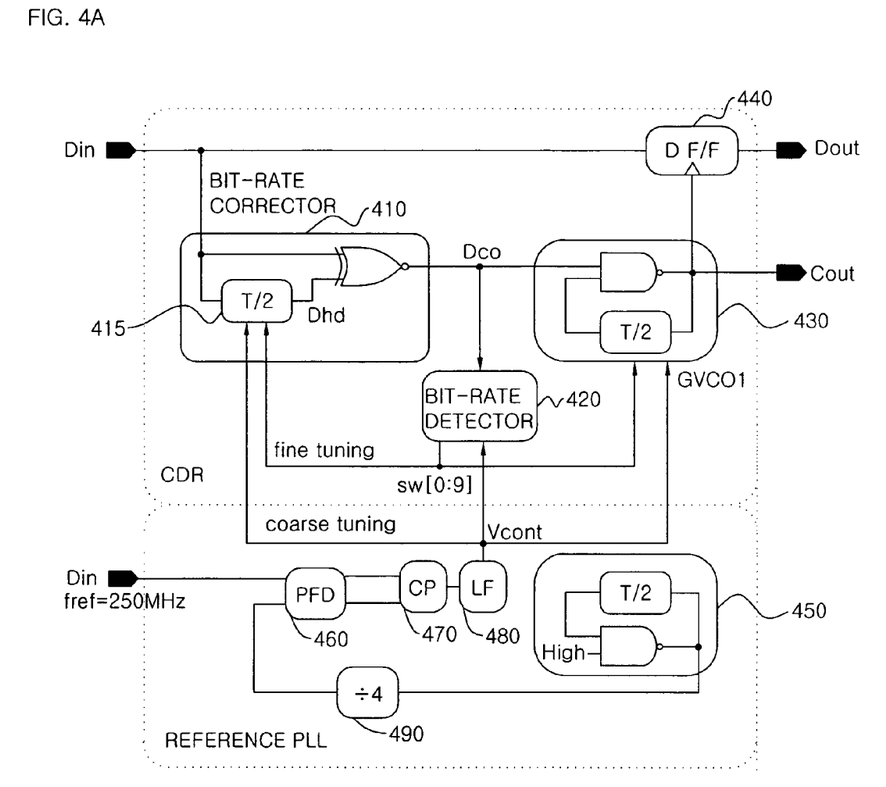
FIG. 4A is a block diagram of a CMOS burst mode CDR circuit using a frequency tracking method according to an embodiment of the present invention.

Referring to FIG. 4A, a CMOS burst mode CDR circuit using a frequency tracking method according to an embodiment of the present invention includes a bit-rate corrector 410, a bit-rate detector 420, a first gated-voltage controlled oscillator (GVCO1) 430, and a D-flipflop 440.

A reference phase locked loop (PLL) includes a phase frequency detector (PFD) 460, a charge pump (CP) 470, a loop filter (LF) 480, a second gated-voltage controlled oscillator (GVCO2) 450, and a division circuit 490. The PFD 460 detects a difference in phase between a signal fref and a feedback input signal that are two input signals and generates two control signals proportional to the phase difference between the two input signals. The CP 470 generates current proportional to the phase difference from control signals generated from the operation of the PFD 460 and provides the generated current to the LF 480.

The LF 480 is typically formed of a low pass filter and not only removes a high frequency component included in an output signal of the CP 470 but also plays an important role in determining a synchronism property or a response property of the reference PLL. A control voltage Vcont that is an output signal of the LF 480 is provided to the bit-rate detector 420 and T/2 delay lines.

The operation of the GVCO2 450 is the same as that of the GVCO1 430. The division circuit 490 that is a feedback block of the reference PLL reduces an output frequency of the GVCO2. In the present embodiment, the division circuit 490 divides a 1 GHz output frequency of the GVCO2 450 by 4 to transfer a signal having a frequency of 250 MHz to the PFD 460.

Since the T/2 delay line of the GVCO1 430 and the T/2 delay line of the bit-rate corrector 410 are controlled by a VCO control voltage of the reference PLL, the operation speed at the initial state is coarsely determined by a clock frequency at a receiving end. When data is input, the bit-rate detector 420 detects the bit rate at a transmitting end and finely controls an operation frequency of each delay line by using a 10-bit digital code. The digital code value changes a load capacitance of the delay line so as to change a frequency after all. The digital coe value of the GVCO3 450 constituting the reference PLL is set such that 3E0(H)=1111100000(2), to maintain the lower five bits of the 10 bits to be "high".

Figure 4B:
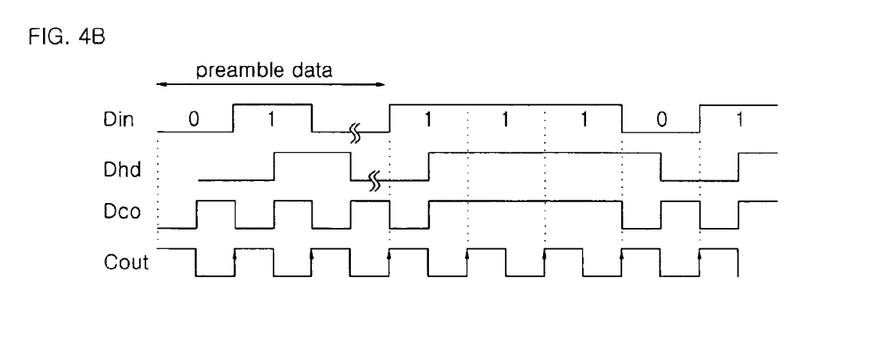
FIG. 4B is a timing diagram of the circuit of FIG. 4A.

The description of the overall operation of the CDR circuit shown in FIG. 4A is shown in the waveform of FIG. 4B.

The bit-rate corrector 410 generates an output signal Dco that is inversed at every half cycle of the clock when transition is generated in the input data Din, and maintains a "high" value with respect to a continuous DC input signal.

The GVCO 430 continuously oscillates at every half cycle when the output signal Dco is "high" so that the rising edge of the output clock Cout is always positioned at a transition point of the input data. Thus, the extraction of a synchronized clock from the input data can be performed in a bit without latency.

The bit-rate detector 420 detects a data transmission rate at the transmission end from the output signal Dco of the bit-rate corrector 410 and adjusts a 10-bit digital code value so that the operation frequency of a CDR loop is the same as the bit rate at the transmission end. The 10-bit digital code linearly changes a load capacitance value of the T/2 delay line in the bit-rate corrector 410 and the GVCO1 430 so that the operation frequency is changed. Such adjustment process is performed during a preamble period of an input data packet.

Also, the GVCO2 450 of the PLL and the GVCO1 430 of the CDR loop, and the T/2 delay line 415 of the bit-rate corrector 410 uses the same block to have the same amount of delay value when the control voltage Vcont is applied.

In the above proposed method, unlike the conventional method shown in FIGS. 1A and 1C, the bit-rate corrector 410 and the GVCO1 430 are connected in series. Since the operation time point of the GVCO1 430 is directly controlled using the output signal Dco, a mismatch effect between the VCOs is reduced compared to a method of independently controlling the operation thereof by connecting the two VOCs in parallel. Thus, a glitch problem of the recovered clock is reduced.

Figure 5A:
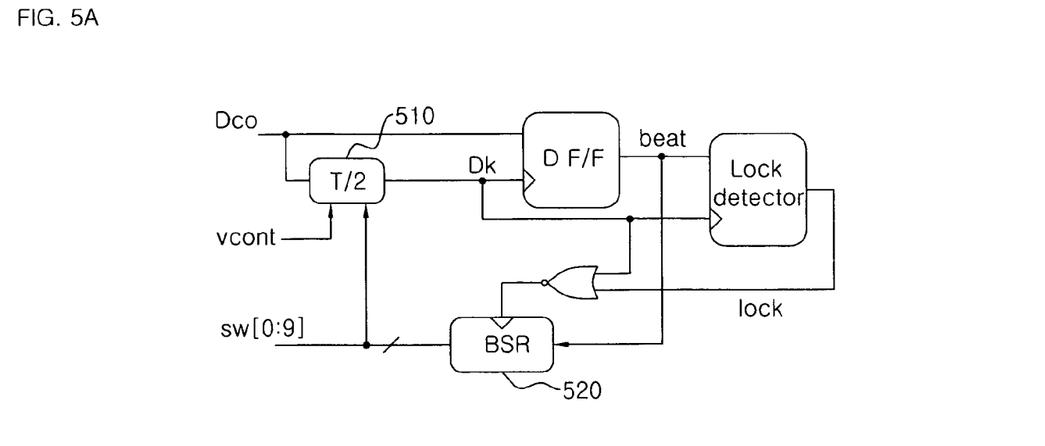
FIG. 5A is a circuit diagram of a bit-rate detector.
Figure 5B:
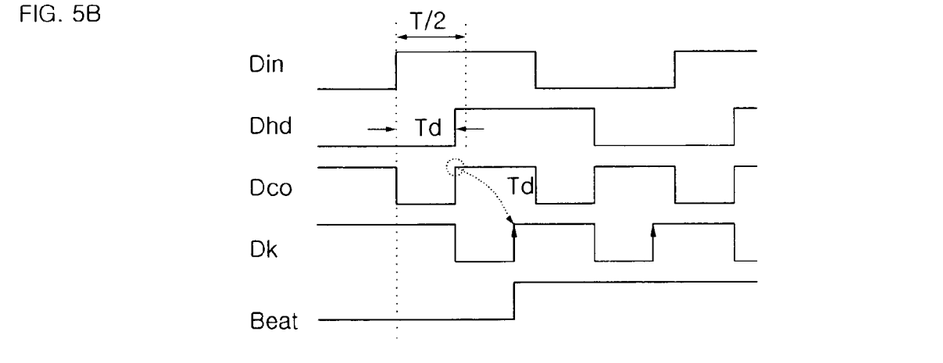
FIG. 5B is a timing diagram of the bit-rate detector of FIG. 5A.
Figure 5C:
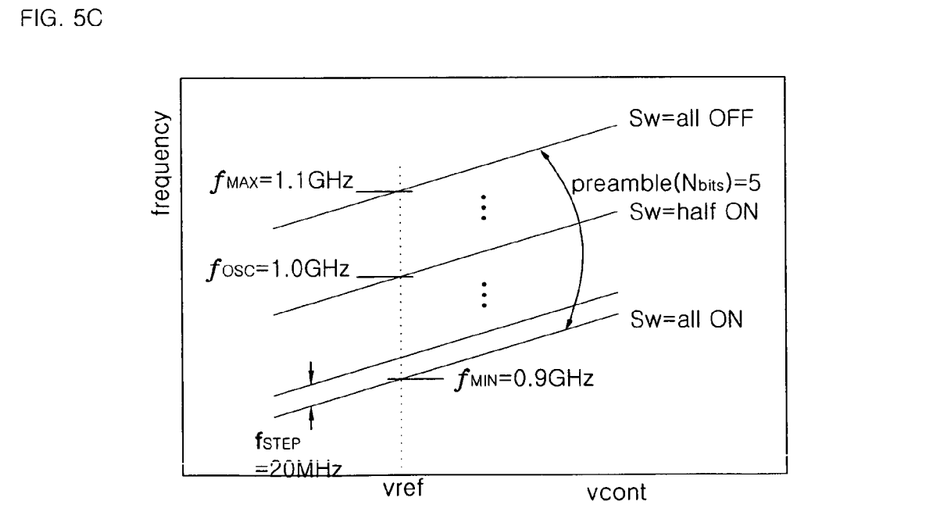
FIG. 5C is a graph showing a change of the operation frequency according to a change of the code value in FIG. 5A.

FIG. 5A is a circuit diagram of a bit-rate detector. FIG. 5B is a timing diagram of the bit-rate detector of FIG. 5A. FIG. 5C is a graph showing a change of the operation frequency according to a change of the code value in FIG. 5A.

The operation of the bit-rate detector 420 is similar to the operation of a digital type duty cycle detector. Since the preamble data transmitted at the initial stage of an input data packet is a cyclic signal repeating high and low every clock cycle T, it can be regarded as a sort of clock signal having a cycle of 2T. In the preamble signal, since the amount of attenuation by a communication channel is the same with respect to the high and low data, the preamble data at the receiving end is the same as a clock source having a 50% duty. Thus, the bit-rate detector 420 detects a difference in the bit rate between the transmission end and the receiving end and generates a digital code value correcting the difference, by comparing the cycle of the preamble data and the clock cycle at the receiving end.

As shown in FIG. 5B, if the duty cycle of the output signal Dco is greater than 50%, this means that the amount of delay of the T/2 delay line is less than the half cycle of the clock at the transmitting end. That is, since the operation frequency at the receiving end is faster than that at the transmitting end, a correction operation needs to be performed in a direction in which a load capacitance of the T/2 delay line increases.

In this case, since the rising edge of a signal Dk having passed a T/2 delay line 510 always samples a "high" portion of the output signal Dco, the output of the D F/F 114 becomes "high". A bi-directional shift register (BSR) 520 increases the digital code value by one bit every clock cycle during when a beat signal is "high". This adjustment step is performed only for a preamble period. When data transmission actually begins, a lock detector detects this state to maintain a lock signal to be "high" so that a supply of clock to the BSR 520 is stopped. Thus, when the preamble beat is complete, the digital code value is fixed to be a constant value so that no more power consumption occurs.

The change of a digital code changes a load capacitance value of a unit delay cell constituting the T/2 delay line and the first GVCO. The control voltage Vcont supplied from the PLL is constantly maintained to be a Vref value during the adjustment step, as shown in FIG. 5C, the change of a code value changes the delay value of the unit delay cell to move a property curve of the VCO so that the operation frequency is change at last.

In the present embodiment, the clock frequency at the receiving end is assumed to be 1 GHZ and an input bit rate allows a 10% change (from 0.9 to 1.1 Gbps). Since a 10-bit digital code is used for the adjustment of a frequency of the CDR loop, the required minimum preamble bit number is 5 bit. Also, since the 10-bit digital code adjusts a range of 200 Mbps, the frequency step interval of the digital code with respect to one bit change is 20 MHz. Accordingly, after the CDR loop is locked, the maximum 2% bit rate error can be present between the bit rates at the transmission and receiving ends.

Figure 6:
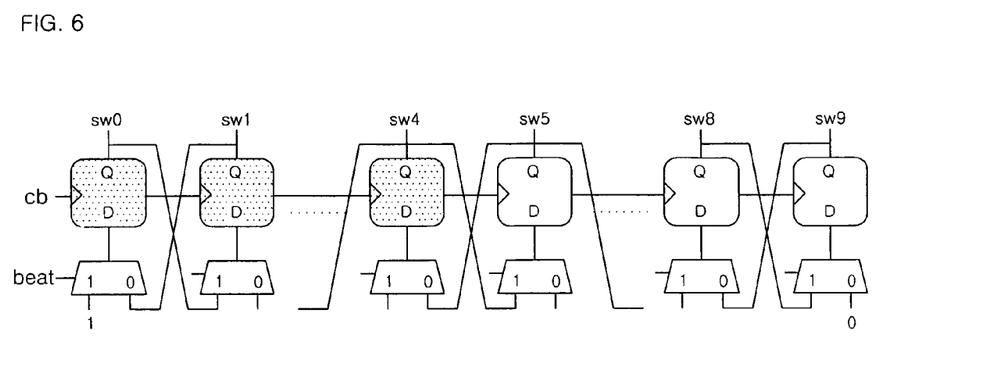
FIG. 6 is a circuit diagram of a bi-directional shift register (BSR)

FIG. 6 is a circuit diagram of the BSR. Referring to FIG. 6, the BSR includes a total of 10 blocks and each unit block includes a D-flipflop and a MUX. The BSR receives "Beat" that is a shift right/left control signal and a clock "cb" and outputs "sw[0:9]" that is a 10-bit digital code. While the "Beat" is "high", a "high" value increases by one bit every clock (shift right). While the "Beat" is "low", a "high" value decreases by one bit (shift left). Thus, the generation of a thermometer code is made.

To set an arbitrary T/2 delay value as an initial value, a flipflop constituting an LSB 5 step is designed to be capable of being "set" while a flopflop constituting an MSB 5 step is designed to be capable of being "reset".

In the CDR according to the present invention, correction of frequency needs to be made within a short preamble period. To this end, the difference in the clock frequency between the transmitting end and the receiving end is compared and an operation to correct the difference must be performed within a short time.

In the BSR, since only a delay of one step of the flipflop and one step of the MUX exists, a high speed correction operation is possible. Also, a binary type counter requires a careful design for linear adjustment of a load capacitance because many bits in the digital code value can be simultaneously changed for the correction operation. In contrast, in the BSR according to the present invention, since only one neighboring bit of the code value changes at one time, linearity is superior.

Figure 7A:
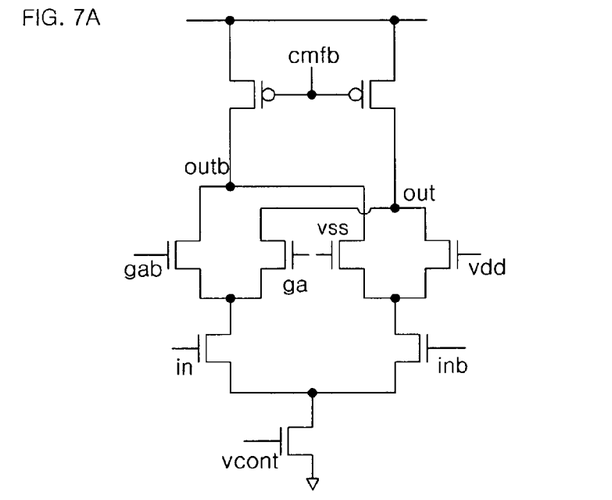
FIG. 7A is a view showing a unit delay line of the GVCO including a function of controlling an oscillating time point in the unit delay line.

FIG. 7A is a view showing a unit delay line of the GVCO including a function of controlling an oscillating time point in the unit delay line. Referring to FIG. 7A, a data input that is an oscillating control signal is applied to a ga/gab while a clock from other delay line is input to an in/inb. When a control signal ga is "high", an out node is discharged and fixed to "low" so that the VCO stops oscillation. When the control signal ga is "low", since an NMOSFET is turned off, it operates as a typical differential delay line.

A control voltage generated from a loop filter is applied to a Vcont node. Since a discharge speed of charges charged at an out/outb node increases as the voltage increases, the amount of delay of the delay line decreases.

A control voltage to control an output voltage common mode of the unit delay line is applied from a common mode feedback (Cmfb) circuit to a common mode feedback (Cmfb) node. The control voltage adjusts the output voltage of the delay line to vary between arbitrary values determined by the VDD and the Cmfb circuit.

Figure 7B:
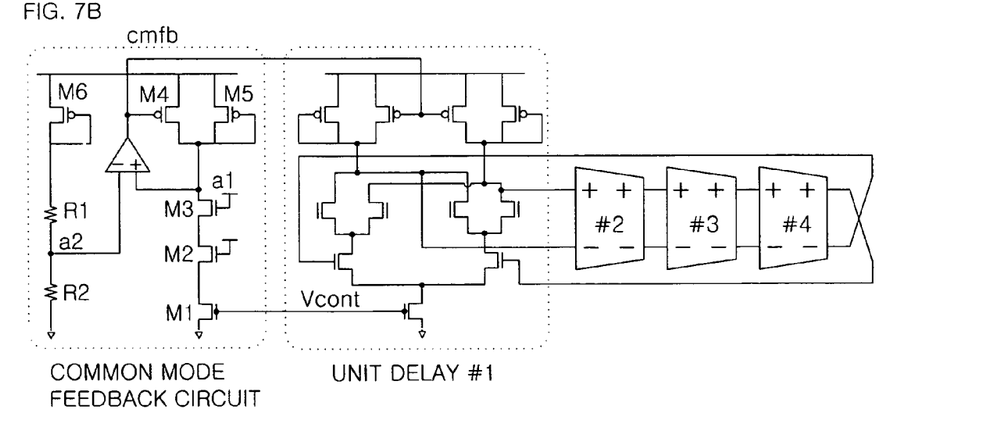
FIG. 7B is a view showing a GVCO which can control the oscillating time point.

FIG. 7B is a view showing a GVCO which can control the oscillating time point. Referring to FIG. 7B, The GVCO includes the 4-step unit delay line and the Cmfb circuit shown in FIG. 7A. M1-M5 are formed of a replica circuit of a unit delay line. An op-amp and an M4 transistor form a negative feedback loop and adjust a gas control voltage of the M4 transistor so that the voltages of an a1 node and an a2 node are identical. Since the control voltage cmfb is commonly applied to the 4-step delay line, the output voltage level of the GVCO clock is maintained as a voltage level of the VDD and the a2 node. The control voltage generated from a loop filter of a PLL is converted to control current by a V-I converter and supplied to the Vcont node.

As described in FIG. 2, in the conventional burst mode CDR, the maximum DC data bit number $N_{MAX}$ which can be transmitted is greatly dependent on a relative frequency difference between a transmitting end and a receiving end and input data jitter $\phi_j$ and can be expressed as in the above Equation 3.

When $f_{diff}$ is 2% and $\phi_j$ is 0.4UI, the maximum DC bit number which can be transmitted without data transfer is 4 bits. This signifies that the coding method such as 8B10B in which $N_{MAX}$=5 bits is not effective any longer in the channel environment.

In the method according to the present invention, in a range in which the $f_{diff}$ is less than 10%, the operational frequency of the CDR loop is always adjusted to be identical with an input bit-rate, $N_{MAX}$ is represented as a function of an input jitter regardless of the $f_{diff}$. When the $f_{diff}$ is greater than 10%, it follows Equation 3 according to the convention method. Thus, the operational property of the CDR can be expressed as in Equation 4.

$$N_{MAX} < 25(1-2\Phi_j) \quad \text{for } f_{\text{diff}} \le 10\% \quad \text{[Equation 4]}$$

$$N_{MAX} < \frac{1}{2(f_{\text{diff}} - 0.1)}(1-2\Phi_j) \quad \text{for } f_{\text{diff}} > 10\%$$

When the $f_{\text{diff}}$ is less than 10%, since a 2% frequency step corresponding to a digital code error of a bit in a lock state can exist, the term "$1/(2 f_{\text{diff}})$" of Equation 3 is fixed to 25 bits in Equation 4, assuming the worst case.

Figure 8:
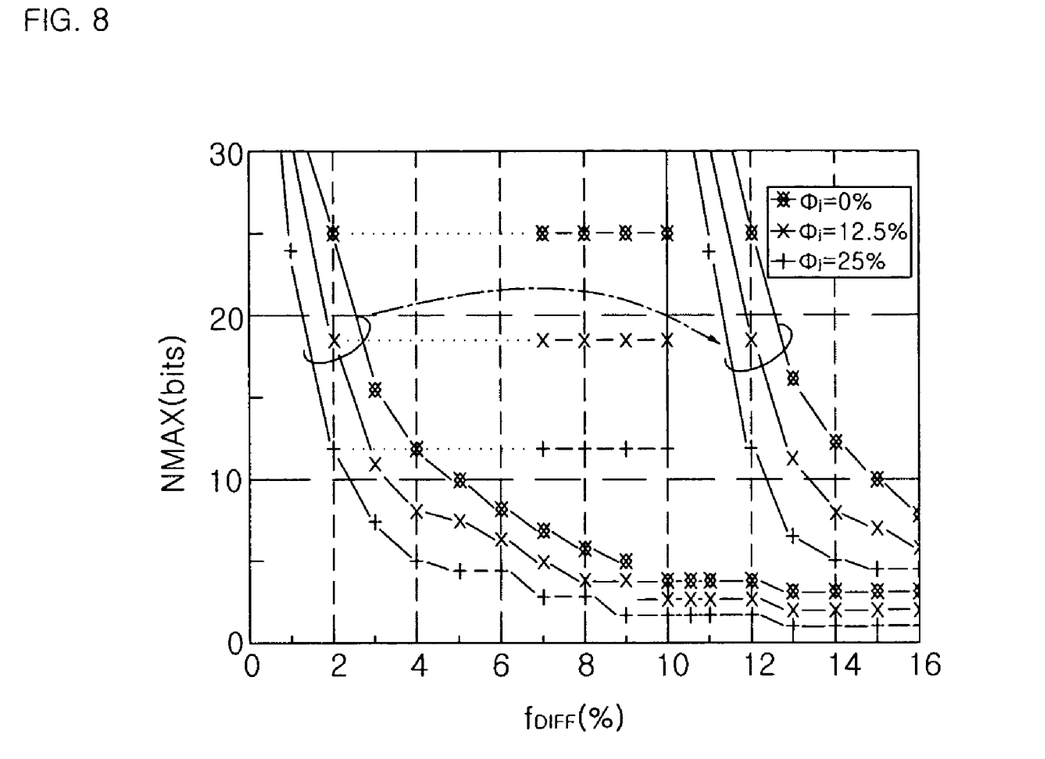
FIG. 8 is a graph showing effects of $N_{MAX}$ according to a change of $f_{diff}$ and $\phi_j$ in the conventional method and a method according to the present method.

FIG. 8 is a graph showing effects of the $N_{MAX}$ according to a change of the $f_{\text{diff}}$ and $\phi_j$ in the conventional method and a method according to the present method. Referring FIG. 8, when the $f_{\text{diff}}$ is greater than 10%, the $N_{MAX}$ of the CDR according to the present invention is the same as one which is obtained by moving the $N_{MAX}$ curve in the conventional method along the $f_{\text{diff}}$ axis by 10%, which shows an improvement by 10% in view of the $f_{\text{diff}}$. When the $f_{\text{diff}}$ is less than 10%, the $N_{MAX}$ according to the present invention has a fixed bit-rate error of 2% due to a frequency step corresponding to a one-bit change of the digital code.

In the CDR according to the present invention, since the bit-rate adjustment range and the preamble bit number can be easily adjusted in design, the fixed bit-rate error can be easily reduced. If the preamble bit number is limited, a trade-off exists between the bit-rate adjustment range and the frequency step. That is, to compensate for the bit-rate difference in a large range using a limited preamble, a demerit that a corresponding amount of the frequency step increases exists.

The burst mode CDR circuit according to the present invention is designed using a 0.25 μm CMOS process and the power consumption and chip size thereof are 40 mW and 520×190 μm, respectively. Comparing to the conventional method, although the chip size increases by 67% due to the addition of the bit-rate detector, since the added bit-rate detector does not operate after the CDR loop is locked, it does not contribute to the power consumption.

While this invention has been particularly shown and described with reference to preferred embodiments thereof, it will be understood by those skilled in the art that various changes in form and details may be made therein without departing from the spirit and scope of the invention as defined by the appended claims.

As described above, according to the present invention, since the GVCO constituting the CDR block and the operation frequency of the delay line are adjusted to be identical with the bit-rate of the input data, the problem of the jitter being accumulated due to the difference in the bit-rate is reduced compared to the conventional method. Also, the effect by the input jitter with respect to the maximum CD bit number which can be transmitted is reduced.

Furthermore, instead of the two VCO structure in a parallel structure operating independently, a CDR in a series structure using a single VCO is realized so that an effect by the mismatch between the two VCOs operating as an open loop is reduced.

What is claimed is:

1. A burst mode clock data recovery circuit for extracting clock information and data information from transmitted data to process data synchronized with clock, the circuit comprising:

a bit-rate corrector generating an inversed signal at every half cycle of the clock when transition of input data is generated according to a voltage controlled oscillator ("VCO") control voltage and a digital code;

a first gated-voltage control oscillator generating an output clock according to the inversed signal, the VCO control voltage and the digital code; and a bit-rate detector generating the digital code according to the VCO control voltage and the inversed signal, wherein the inversed signal maintains a logic-high value when the voltage value of the input data is continuously a DC voltage, wherein a delay time of a delay circuit contained in the first gate-voltage control oscillator and the bit-rate corrector is adjusted based on the VCO control voltage and the digital code, and wherein the VCO control voltage is applied by a phase lock loop ("PLL") which locks a predetermined reference frequency signal.

2. The circuit of claim 1, wherein the bit-rate corrector comprises a delay line and a logic gate and generates a correction signal using binary information on a cycle of the clock.

3. The circuit of claim 2, wherein the delay circuit delays an input signal as long as half of the cycle of the clock.

4. The circuit of claim 2, wherein the logic gate performs an exclusive NOR function.

5. The circuit of claim 2, wherein the information on the cycle of the clock is twice the cycle of the clock.

6. The circuit of claim 2, wherein the correction signal has the same cycle as that of the clock.

7. The circuit of claim 1, wherein the bit-rate detector comprises:

a T/2 delay line delaying half of the cycle of the clock T/2 of the inversed signal output from the bit-rate corrector;

a flipflop in which output thereof is "high" or "low" as a rising edge of a signal having passed the T/2 delay line always samples a "high" or "low" portion of the inversed signal;

a shift resister increasing the digital code value by one bit at every clock cycle during which a beat signal output from the flipflop is "high"; and a lock detector detecting a state of the beat signal to maintain a lock signal to be "high" and discontinuing supply of the clock to the shift resister.

8. The circuit of claim 7, wherein the flipflop is a D-flipflop.

9. The circuit of claim 7, wherein the shift resister is a resister having a bidirectional shifting function.

10. The circuit of claim 7, wherein the bit-rate detector detects a difference in bit-rate between the transmitting end and the receiving end and generating the digital code value to correct the difference, by comparing a periodicity of a preamble data and a clock cycle at a receiving end.

11. The circuit of claim 10, wherein the digital code is a digital thermometer code of multiple bits and controls the first gated-voltage control oscillator and a load capacitance value of the T/2 delay line to finely adjust operational frequencies of two unit blocks.

12. The circuit of claim 7, wherein the shift resister comprises a plurality of blocks and each unit block comprises a D-flipflop and a Multiplexer.

13. The circuit of claim 7, wherein, in the shift resister, to provide a T/2 delay value that is a half cycle of the clock signal as an initial value, a flipflop constituting an least-significant bit ("LSB") 5 step is designed to be "set" and a flipflop constituting the other most-significant bit ("LSB") 5 step is designed to be "reset".

14. The circuit of claim 1, wherein the first gated-voltage control oscillator comprises a unit delay line having a function of controlling oscillating time.

15. The circuit of claim 1, wherein the bit-rate corrector and the first gated-voltage control oscillator are connected in series.

16. The circuit of claim 1, wherein the phase locked loop comprises a phase frequency detector, a loop filter, a charge pump, a second gated-voltage control oscillator, and a delay line delaying corresponding to one forth of the clock signal.

17. The circuit of claim 16, wherein the charge pump and the second gated-voltage control oscillator are connected in series.

18. The circuit of claim 1, wherein the first gated-voltage control oscillator and the second gated-voltage control oscillator are amplifiers having differential input.

19. The circuit of claim 1, wherein bias voltages of the first gated-voltage control oscillator and the second gated-voltage control oscillator are voltages generated by a common mode feedback.

20. The circuit of claim 12, wherein, in the shift resister, to provide a T/2 delay value that is a half cycle of the clock signal as an initial value, a flipflop constituting an least-significant bit ("LSB") 5 step is designed to be "set" and a flipflop constituting the other most-significant bit ("LSB") 5 step is designed to be "reset".

21. The circuit of claim 16, wherein the first gated-voltage control oscillator and the second gated-voltage control oscillator are amplifiers having differential input.

22. The circuit of claim 16, wherein bias voltages of the first gated-voltage control oscillator and the second gated-voltage control oscillator are voltages generated by a common mode feedback.

* * * * *